(12) United States Patent
Kitamura et al.

(10) Patent No.: US 6,998,680 B2
(45) Date of Patent: Feb. 14, 2006

(54) SEMICONDUCTOR DEVICE

(75) Inventors: Akio Kitamura, Nagano (JP); Mutsumi Kitamura, Nagano (JP)

(73) Assignee: Fuji Electric Co., Ltd., (JP)

( * ) Notice: Subject to any disclaimer, the term of this patent is extended or adjusted under 35 U.S.C. 154(b) by 147 days.

(21) Appl. No.: 10/648,050

(22) Filed: Aug. 26, 2003

(65) Prior Publication Data

US 2004/0108551 A1   Jun. 10, 2004

(30) Foreign Application Priority Data

Oct. 30, 2002   (JP) ............................. 2002-315988

(51) Int. Cl.
   *H01L 29/76*   (2006.01)

(52) U.S. Cl. ........................ 257/342; 257/300; 257/340

(58) Field of Classification Search ................. 257/342
   See application file for complete search history.

(56) References Cited

U.S. PATENT DOCUMENTS 5,701,026 A * 12/1997 Fujishima et al. .......... 257/510
6,174,773 B1 * 1/2001 Fujishima .................. 438/270
6,177,704 B1 * 1/2001 Suzuki et al. ............... 257/343

FOREIGN PATENT DOCUMENTS

JP   9-321291   12/1997

* cited by examiner

*Primary Examiner*—Thao P. Le
(74) *Attorney, Agent, or Firm*—Rossi, Kimms & McDowell, LLP

(57) ABSTRACT

A semiconductor device, namely a lateral MOSFET, facilitates to reduce the on-resistance per unit area. The lateral MOSFET exhibiting a high breakdown voltage includes a semiconductor substrate of a first conductivity type, trenches formed in semiconductor substrate and aligned in the channel in the width direction of the MOSFET, a drain drift region of a second conductivity type surrounding the trenches from the side of the side walls and bottom walls thereof, an insulator in each trench, and a region doped with an impurity of the first conductivity type and extending between the trenches.

20 Claims, 8 Drawing Sheets

SEMICONDUCTOR DEVICE

BACKGROUND

The so called trench MOSFETs have been developed as one type of vertical MOSFETs. The trench MOSFET includes trenches and a gate electrode buried in the trench so that channels can be formed along the side walls of the trenches. The trench MOSFET is advantageous for reducing the cell pitch and the on-resistance per unit area. Although some trench structures have been proposed and reported in the lateral MOSFET, no trench lateral MOSFET has been actually put to use in a practical power IC.

One of the trench structures proposed in a lateral MOSFET is illustrated in FIGS. 11–13, which is disclosed in Japanese Unexamined Laid Open Patent Application H09 (1997)-321291 (pp. 3 and 4, FIGS. 1–4). FIG. 11 is a top plan view of a conventional trench lateral MOSFET. FIG. 12 is a cross section taken along line XII—XII of FIG. 11. FIG. 13 is another cross section taken along line XIII—XIII of FIG. 11. The conventional trench lateral MOSFET includes a p-type silicon substrate 101, an $n^-$-type extended drain region 103 in the surface portion of p-type substrate 101, a plurality of trenches 102 in the $n^-$-type extended drain region 103, and a p-type diffusion region 114 surrounding each trench 102. Another p-type diffusion region 115 is in the $n^-$type extended drain region 103. Since the p-type diffusion regions 114 and 115 form around the trenches 102, the portion of the $n^-$type extended drain region 103, where the depletion layers expanding from the pn-junctions between the p-type substrate 101 and the $n^-$-type extended drain region 103 and from the pn-junction between the p-type diffusion region 114 and the $n^-$-type extended drain region 103 hardly reach, becomes depleted. Therefore, the entire $n^-$-type extended drain region 103 is depleted easily. And, it becomes possible to expand the depletion layers long enough to relax the voltage caused between the source and the drain even when the resistance of the $n^-$-type extended drain region 103 is set lower than that in the conventional lateral MOSFET.

In the trench lateral MOSFET exhibiting a high breakdown voltage of 50 V or higher, the drain resistance occupies a large part of the total resistance of the device. Therefore, there is a need for a semiconductor device having a structure that facilitates to reduce the on-resistance per unit area greater than conventional trench lateral MOSFETs while securing the desired breakdown voltage. The present invention addresses this need.

SUMMARY OF THE INVENTION

The present invention relates to a semiconductor device. Specifically, the present invention relates to a semiconductor device for constituting a MOSFET exhibiting a high breakdown voltage used for power ICs.

A semiconductor device according to the present invention can include a semiconductor region, a source region, a drain region, trenches, an insulator, a drain drift region, a gate insulation film, gate, drain, and source electrodes.

The semiconductor region can be of a first conductivity. The source region can be of a second conductivity type formed on one side of the semiconductor region. The drain region can be of the second conductivity type also formed on the same side as the source region, but spaced apart laterally from the source region. The trenches can be formed on the same one side of the semiconductor region, between the source region and the drain region, and spaced apart from the source region. The insulator fills each of the trenches. The drain drift region can be of the second conductivity type formed in the semiconductor region. The drain drift region can be connected to the drain region and can extend along the side and bottom walls of the trenches. The drain drift region can be spaced apart from the source region. The gate insulation film can be formed on the surface of the one side of the semiconductor region between the source region and the drain drift region. The gate electrode can be on the gate insulation film, the source electrode can be connected electrically to the source region, and the drain electrode can be connected electrically to the drain region. The trenches can be aligned in the width direction of the channels formed beneath the gate insulation film.

The semiconductor device can have a first triple layer structure formed of the drain drift region, the semiconductor region, and the drain drift region, the triple layer structure being between the adjacent trenches such that the drain drift region is between the adjacent trenches.

The semiconductor device can have one or more electrical conductors formed in the insulator in each of the trenches. The one or more electrical conductors can extend parallel to a side wall of the trench formed between adjacent trenches. The thickness of the insulator between the one or more electrical conductors and the side wall of the trench on the drain side can be larger than the thickness of the insulator between the one or more electrical conductors and the side wall of the trench on the source side.

The semiconductor device can further include a well region of the first conductivity type doped more heavily than the semiconductor region, the drain drift region being in the well region, and a second triple layer structure formed of the drain drift region, the well region, and the drain drift region formed between the adjacent trenches.

The semiconductor device can further include one or more electric field relaxation layers of the first conductivity type in the drain drift region, and along the trenches. The electric field relaxation layer can be in the drain drift region between adjacent trenches. The electric field relaxation layers can be on the boundary between the drain drift region and the insulator in the trench.

BRIEF DESCRIPTION OF THE DRAWINGS

FIG. 4(*b*) is a cross section taken along line IVb—IVb of FIG. 4(*a*).

FIG. 6(*b*) is a cross section taken along line VIb—VIb of FIG. 6(*a*).

FIG. 9(*b*) is a top plan view of a modification of the trench of the semiconductor device of FIG. 9(*a*).

FIG. 9(*c*) is a top plan view of another modification of the trench of the semiconductor device of FIG. 9(*a*).

FIG. 10(*b*) shows other equipotential curves describing the function of the electrical conductor according to the present invention.

DETAILED DESCRIPTION

The accompanying drawing figures are schematics. Accordingly, they do not accurately represent the actual dimensions of the constituent elements. Although the first conductivity type refers to a p-type and the second conductivity type to an n-type in the following descriptions, the present invention is applicable also to semiconductor devices, in which the first conductivity type is an n-type and the second conductivity type a p-type.

Figure 1:
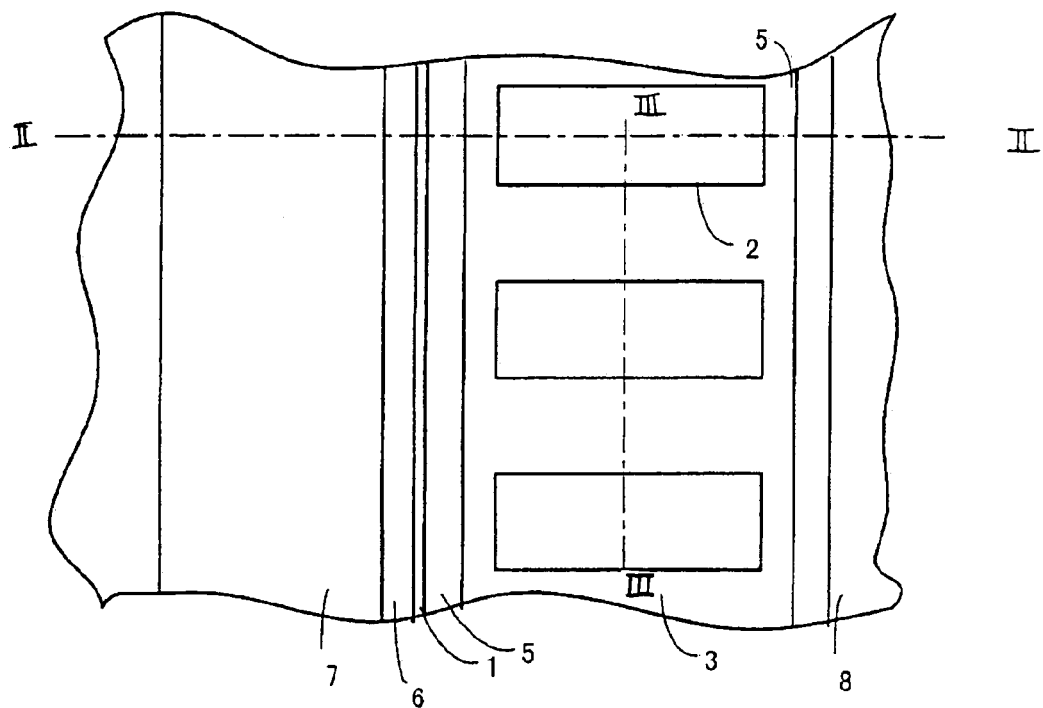
FIG. 1 is a top plan view of a first embodiment of a semiconductor device according to the present invention.
Figure 2:
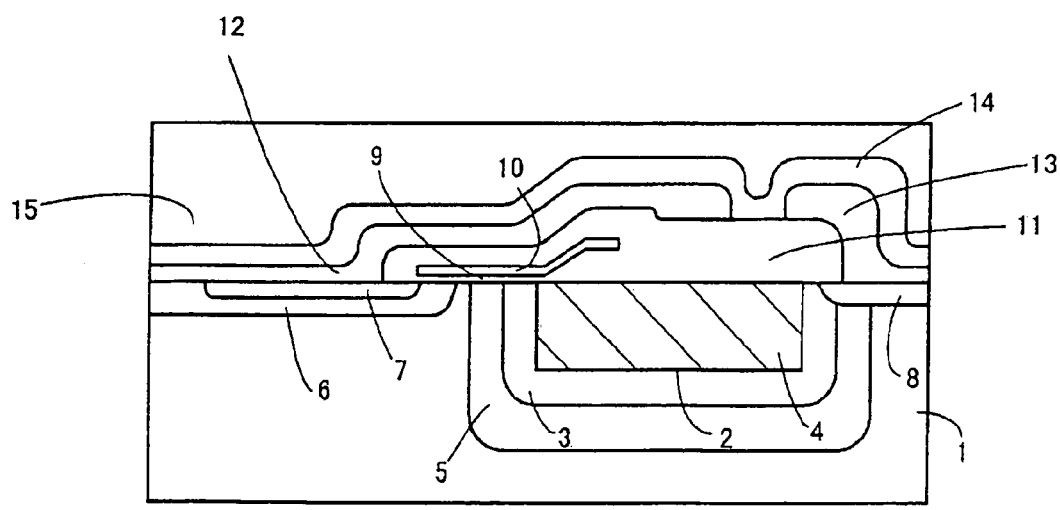
FIG. 2 is a cross section taken along line II—II of FIG. 1.
Figure 3:
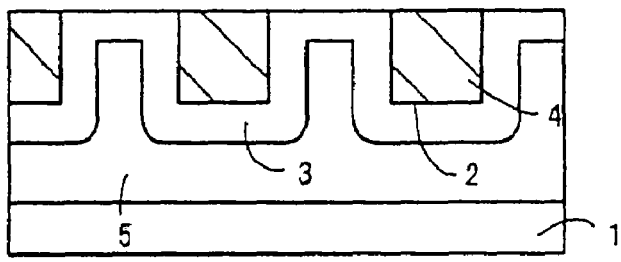
FIG. 3 is another cross section taken along line III—III of FIG. 1.

FIGS. 1–3 illustrate a first embodiment of a semiconductor device according to the present invention, more specifically a trench lateral MOSFET. Here, the trench lateral MOSFET includes a p-type semiconductor region 1, trenches 2, an n⁻-type drain drift region 3, an insulator 4 buried in each trench 2, a p-type well region 5, a p-type base region 6, an n⁺-type source region 7, an n⁺-type drain region 8, an oxide gate insulation film 9, a polysilicon gate electrodes 10, an interlayer insulation film 11, a source electrode 12, a drain electrode 13, a passivation film 14, and a mold resin 15. The p-type well region 5 can be omitted if desired.

The trenches 2 are formed from one side (surface portion) of the p-type semiconductor region 1, and each of the trenches 2 is filled with the insulator 4. The n⁻-type drain drift region 3 surrounds (i.e., forms) the side walls and bottom walls of trenches 2. The p-type well region 5 contacts the n⁻-type drain drift region 3 away from the trenches 2. The n⁺-type source region 7 is in the surface portion of the p-type base region 6 and spaced apart from the n⁻-type drain drift region 3. The n⁺-type drain region 8 is in the drain side surface portion of n⁻-type drain drift region 3, which is spaced apart from the source side for trenches 2. The gate insulation film 9 is on the surface of the semiconductor region 1, extending from the n⁺-type source region 7 and over the n⁻-type drain drift region 3. The gate electrode 10 is on the gate insulation film 9 and extends above the trenches 2, parallel to the surface of the semiconductor region. The interlayer insulation film 11 covers the upper portions of the gate electrode 10 and the trenches 2. The drain electrode 13 is connected electrically to the n⁺-type drain region 8 and extends above the trenches 2 along the interlayer insulation film 11, parallel to the surface of the semiconductor region. The source electrode 12 is connected electrically to the p-type base region 6 and the n⁺-type source region 7. The source electrode 12 extends above the trenches 2 along the interlayer insulation film 11, parallel to the surface of the semiconductor region. The drain electrode 13 and the source electrode 12 are spaced apart and insulated from each other. The passivation film 14 covers the entire structure described above. The mold resin 15 air tightly seals the semiconductor device. As illustrated in FIG. 3, the p-type well region 5, which is a region doped with a p-type impurity, extends between the trenches 2.

Now the method of manufacturing the semiconductor device having a structure described in FIGS. 1–3 will be described below. The p-type well region 5 is formed in the surface portion of a p-type CZ substrate, the specific resistance thereof is from 10 to 15 Ωcm, such that the surface impurity concentration of the resulting p-type well region 5 is around $1 \times 10^{16}$ cm$^{-3}$ and the thickness thereof is 4 μm. The trenches 2, with 3 μm in length, 2 μm in width, and 2 μm in depth, are formed in the p-type well region 5. The trenches 2 are aligned in the width direction of the channels formed in the surface portion of semiconductor region 1 beneath the gate insulation film 9. The adjacent trenches 2 are spaced apart by 3 μm from each other. Ions of P31 are implanted at the dose amount of around $6 \times 10^{12}$ cm$^{-2}$ obliquely to the side walls of the trenches 2 and perpendicularly to the bottom walls of the trenches 2. Then, the side walls and the bottom walls of the trenches 2 are oxidized thermally, and then the trenches 2 are filled with a CVD oxide film. Then, a mask is formed on the semiconductor chip and ions of P13 are implanted to the surface portions of semiconductor region 1 between the trenches 2 at the dose amount of around $6 \times 10^{12}$ cm$^{-2}$. Then, the n⁻-type drain drift region 3 is formed by driving the implanted P13 at 1150° C. for 60 minutes such that the n⁻-type drain drift region 3 is formed between the trenches and along the side walls and bottom walls of the trenches 2. Alternatively, the n⁻-type drain drift region 3 can be formed by depositing doped polysilicon films in the formed trenches 2 by the vacuum CVD technique using silane and phosphine for phosphorus ion doping and then driving the phosphorus atoms.

Then, the gate insulation film 9 of 200 angstrom thick is formed. Then, the gate electrode 10 is formed by depositing polysilicon on the gate insulation film 9 and by the photo-etching technique. The edge portion of the gate electrode 10 on the drain side extends above the trenches 2. The p-type base region 6 and the n⁺-type source region 7 are formed in the surface portion of the semiconductor region 1 by the self-alignment technique using the other edge portion of the gate electrode 10 on the source side. The p-type base region 6 surrounds the bottom and side walls of the n⁺-type source region 7. The n⁺-type drain region 8 is formed simultaneously with or individually from the n⁺-type source region 7 in the surface portion of the n⁻-type drain drift region 3 spaced apart from the n⁺-type source region 7 for the trenches 2. After the interlayer insulation film 11 is deposited, the source electrode 12 is formed such that the source electrode 12 extends above the trenches 2 and the drain electrode 13 is formed such that the drain electrode 13 extends above the trenches 2. Finally, a plasma nitride passivation film 14 is coated on the semiconductor structure formed as described above, and the semiconductor device fabricates as described above is sealed in a mold resin. The manufacturing process described above is not so difficult since the manufacturing process described above merely adds the steps of forming and filling the trenches 2 to the manufacturing process for manufacturing the conventional lateral MOSFETs.

Since the trenches 2 are first formed and then the n⁻-type drain drift region 3 is formed along the side walls of the trenches 2 according to the first embodiment, currents flow along the side walls of the trenches 2, reducing the on-resistance. Moreover, since the p-type well region 5 doped with a p-type impurity extends between the trenches 2, the pn-junction area between the n⁻-type drain drift region 3 and the p-type well region 5 is widened, facilitating depletion of the n⁻-type drain drift region 3. Since the n⁻-type drain drift region 3 can be doped heavily, the tradeoff relation between the breakdown voltage and the on-resistance per unit area can be reduced.

Although the p-type well region 5 extends between the trenches 2 according to the first embodiment, it is sufficient for the regions between the trenches 2 to be of the p-type. Therefore, it is not always necessary to form p-type well region 5 between the trenches 2. When a p-type well region 5 is not formed, the extended portion of the p-type semiconductor region 1 extends between the trenches 2 to exhibit the effects described above.

Figure 4A:
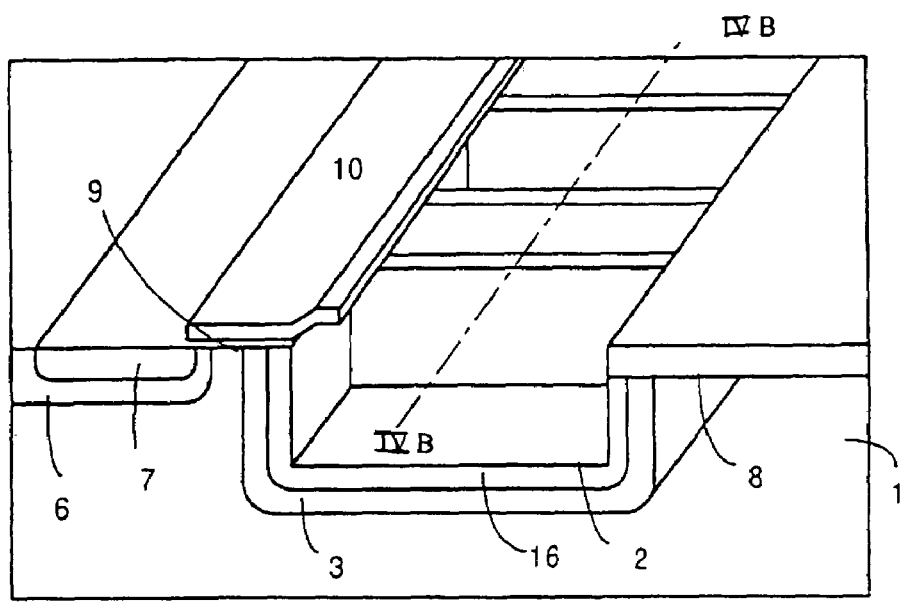
FIG. 4(*a*) is a perspective view of a second embodiment of a semiconductor device according to the present invention.
Figure 4B:
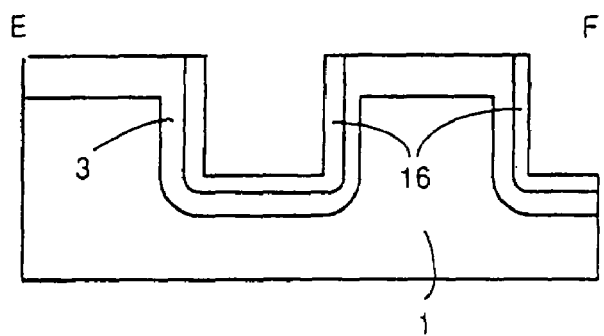

FIGS. 4(a) and 4(b) illustrate a second embodiment of the semiconductor device according to the present invention. The semiconductor device according to the second embodiment is similar to the first embodiment, but it further includes p⁻-type electric field relaxation layers 16 formed more shallowly than the n⁻-type drain drift region 3 along the side walls and bottom walls of the respective trenches 2. In other words, the p⁻-type electric field relaxation layers 16 are formed between the n⁻-type drain drift region 3 and the trenches 2. Although a p-type well region 5 is not formed in the second embodiment, a p-type well region 5 can be included if desired.

Since the n⁻-type drain drift region 3 is between the p-type semiconductor region 1 and the p⁻-type electric field relaxation layer 16, the n⁻-type drain drift region 3 can be depleted by the depletion layers expanding from the pn-junction between the n⁻-type drain drift region 3 and the p-type semiconductor region 1, and from the pn-junctions between the n⁻-type drain drift region 3 and the p⁻-type electric field relaxation layers 16. Therefore, the p⁻-type electric field relaxation layers 16 added to the semiconductor structure according to the first embodiment facilitate doping of the n⁻-type drain drift region 3 more heavily. Since there exists a quinary layer structure consisting of the p⁻-type electric field relaxation layer 16, the n⁻-type drain drift region 3, the p-type semiconductor region 1, the n⁻-type drain drift region 3, and the p⁻-type electric field relaxation layer 16 between the adjacent trenches 2, an alternating conductivity type layer structure, which facilitates to reduce the on-resistance per unit area, can be attained by optimizing the thickness of each constituent layer and such parameters.

Now the method of manufacturing the semiconductor device having a structure described in FIGS. 4(a) and 4(b) will be described below. The trenches 2, with 3 μm in length, 2 μm in width, and 2 μm in depth, are formed selectively in the surface portion of a p-type CZ substrate, the specific resistance thereof being from 10 to 15 Ωcm, such that trenches 2 are aligned in the width direction of the channels formed in the surface portion of the semiconductor region 1 beneath the gate insulation film 9. The adjacent trenches 2 are spaced apart by 3 μm from each other. Phosphorus ions are implanted obliquely into the side walls of the trenches 2 and perpendicularly into the bottom walls of the trenches 2. Then, boron ions are implanted into the side walls and bottom walls of the trenches 2 in the similar manner as for the n⁻-type drain drift region 3. Then, the side walls and the bottom walls of the trenches 2 are oxidized thermally, and then the trenches 2 are filled with a CVD oxide film.

Then, a mask is formed on the semiconductor chip and phosphorus ions are implanted into the surface portions of the semiconductor region 1 between the trenches 2. Then, the implanted phosphorus atoms are driven at 1150° C. for 60 minutes such that the p⁻-type electric field relaxation layers 16 are between trenches 2 and formed along the side walls and bottom walls of the trenches 2. Preferably, the surface impurity concentration of the p-type electric field relaxation layer 16 is from $1 \times 10^{16}$ to $1 \times 10^{17}$ cm⁻³. Then, the subsequent steps are conducted in the same way as according to the first embodiment. Since the n⁻-type drain drift region 3 in the lateral MOSFET manufactured as described above can be doped heavily, the trench lateral MOSFET according to the second embodiment facilitates to reduce the on-resistance thereof.

Figure 5:
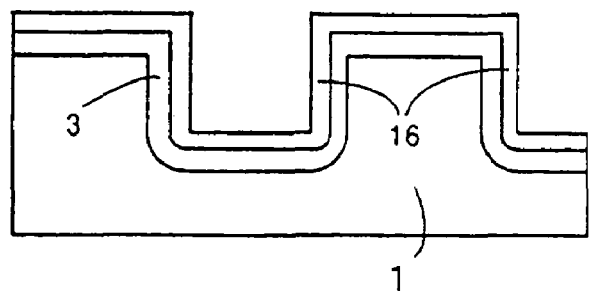
FIG. 5 is a cross sectional view of a third embodiment of a semiconductor device according to the present invention.

FIG. 5 illustrates a third embodiment of a semiconductor device according to the present invention. Here, the third embodiment is different from the second embodiment in that the p⁻-type electric field relaxation layer 16 is also in the surface portion of semiconductor region 1 between the adjacent trenches 2 in third embodiment. Since the structure described above facilitates heavily doping of the n⁻-type drain drift region formed in the surface portion of semiconductor region 1, the semiconductor device according to the third embodiment facilitates to reduce the on-resistance more effectively than the semiconductor device according to the second embodiment.

Now the method of manufacturing the semiconductor device having a structure described in FIG. 5 will be described below. The steps for manufacturing the semiconductor device according to the third embodiment from the start until filling trenches 2 with a CVD oxide film are conducted in the same way as in the second embodiment. Thereafter, a mask is formed on the semiconductor chip and phosphorus ions are implanted into the surface portion of the semiconductor region 1 between the adjacent trenches 2. Then, boron ions are implanted into the surface portion of the semiconductor region 1 between adjacent the trenches 2. Then, the implanted atoms are driven at 1150° C. for 60 minutes such that the n⁻-type drain drift region 3 and the p⁻-type electric field relaxation layer 16 are in the surface portion of the semiconductor region 1 extending between the trenches 2 and extending along the side walls and bottom walls of the trenches 2. Then, the succeeding steps for manufacturing semiconductor device according to the third embodiment are conducted in the same way as in manufacturing semiconductor device according to the second embodiment. Since the n⁻-type drain drift region 3 in the semiconductor device according to the third embodiment can be doped more heavily than the n⁻-type drain drift region 3 in the semiconductor device according to the second embodiment, the on-resistance is further reduced.

Figure 6A:
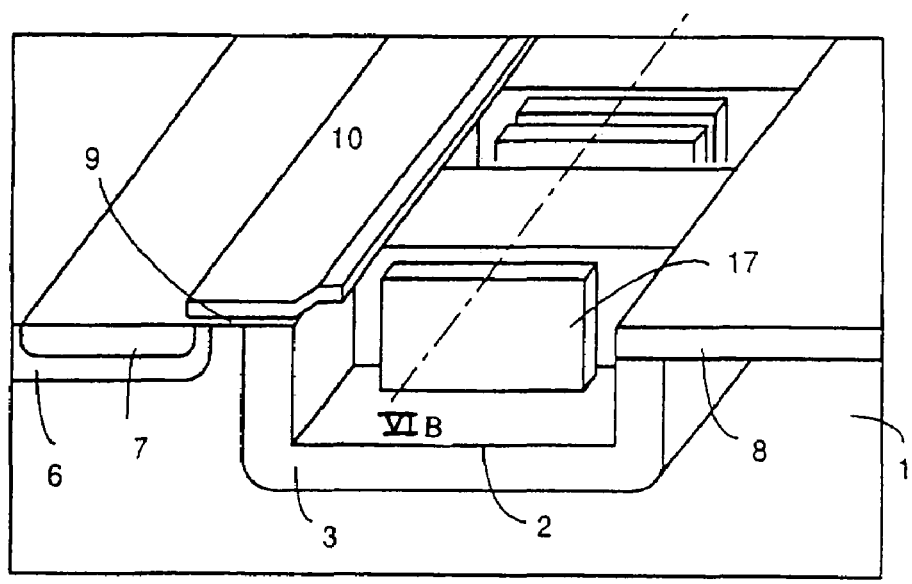
FIG. 6(*a*) is a perspective view of a fourth embodiment of a semiconductor device according to the invention.
Figure 6B:
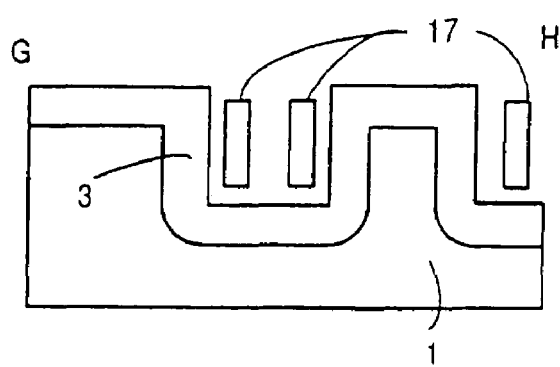

FIGS. 6(a)-6(b) illustrate a fourth embodiment of a semiconductor device according to the present invention. The fourth embodiment further includes electrical conductors 17 (insulator 4 omitted) in each trench 2. The electrical conductors 17 are connected electrically, for example, to the source electrode 12 via contact means (not illustrated) formed through the interlayer insulation film 11. The p-type well region 5 is not formed in the semiconductor device according to the fourth embodiment. Since the n⁻-type drain drift region 3 between the trenches 2 is depleted due to the field plate effect in which the electrical conductors 17 exhibit, the n⁻-type drain drift region 3 can be doped heavily so that the on-resistance per unit area is reduced.

Now the method of manufacturing the semiconductor device having a structure described in FIGS. 6(a) and 6(b) will be described below. The trenches 2, with 3 μm in length, 2 μm in width, and 2 μm in depth, are formed selectively in the surface portion of a p-type CZ substrate, the specific resistance thereof being from 10 to 15 Ωcm, such that the trenches 2 are aligned in the width direction of the channels formed in the surface portion of the semiconductor region 1 beneath the gate insulation film 9. The adjacent trenches 2 are spaced apart by 3 µm from each other. Phosphorus ions are implanted obliquely into the side walls of the trenches 2 and perpendicularly into the bottom walls of the trenches 2. Then, the side walls and the bottom walls of the trenches 2 are oxidized thermally, and a CVD insulation film is deposited to fill each trench 2 with insulator 4. The trenches are formed by the photoetching technique in insulator 4 and the formed trenches are filled with doped polysilicon such that the electrical conductors 17 are in each trench 2. Then, the semiconductor device according to the fourth embodiment is manufactured in the same way as the semiconductor device according to the first embodiment. The n⁻-type drain drift region 3 in the semiconductor device according to the fourth embodiment can be doped more heavily than the n⁻-type drain drift region 3 in the semiconductor device according to the first embodiment.

Figure 7:
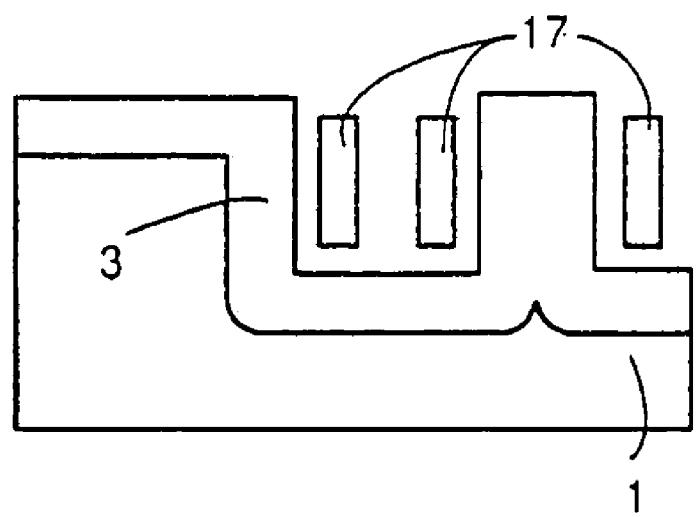
FIG. 7 is a cross sectional view of a fifth embodiment of a semiconductor device according to the present invention.

FIG. 7 illustrates a fifth embodiment of a semiconductor device according to the present invention. In the fifth embodiment, the region between the adjacent trenches 2 is occupied solely by the n⁻-type drain drift region 3. There exists no semiconductor region 1 between the adjacent trenches 2 in the semiconductor device according to the fifth embodiment. The n⁻-type drain drift region 3 between the adjacent trenches 2 can be depleted by the electrical conductors 17. The semiconductor device according to the fifth embodiment is manufactured in the same way as the semiconductor device according to the fourth embodiment except that the trenches 2 are spaced apart by 1 µm from each.

Figure 8:
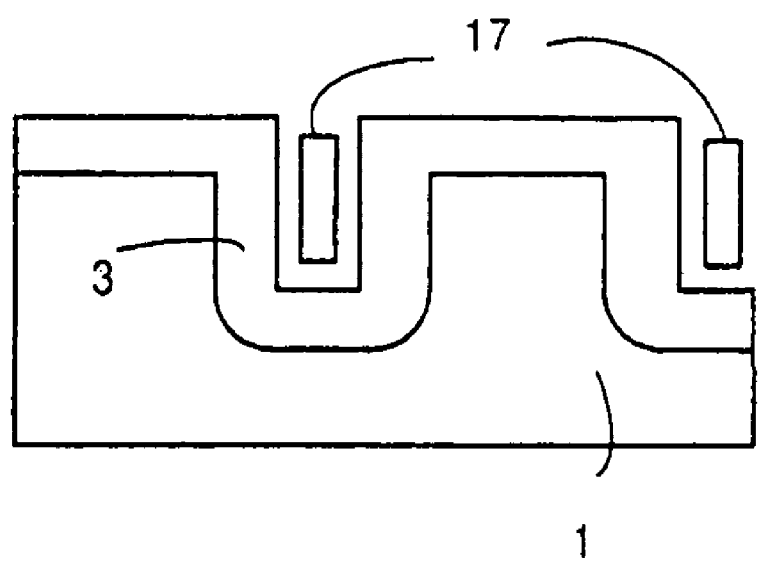
FIG. 8 is a cross sectional view of a sixth embodiment of a semiconductor device according to the present invention.

FIG. 8 illustrates a sixth embodiment of a semiconductor device according to the present invention. The semiconductor device according to the sixth embodiment is a modification of the semiconductor device according to the fourth embodiment. Whereas the fourth embodiment uses two electrical conductors 17 in each trench 2, the sixth embodiment uses only one electrical conductor 17 in each trench 2. Since it is enough to form only one electrical conductor 17 in each trench 2, the trench width in the semiconductor device according to the sixth embodiment can be set narrower than the trench width in the semiconductor device according to the fourth embodiment. Since more trenches 2 can be formed by virtue of the narrower width thereof, the semiconductor device according to the sixth embodiment facilitates to further reduce the on-resistance. Typically, the trench width can be set at 1 µm in the semiconductor device according to the sixth embodiment.

Figure 9A:
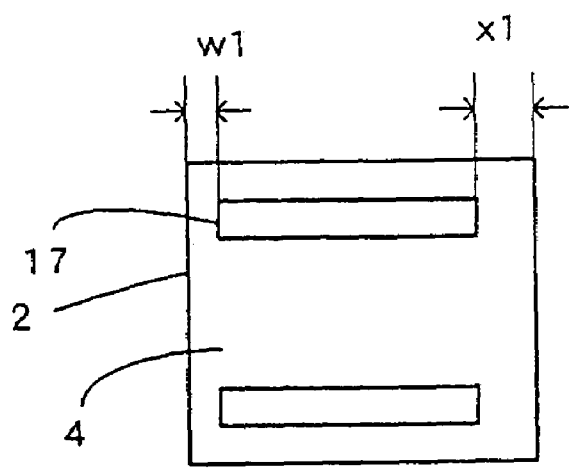
FIG. 9(*a*) is a top plan view of the trench of a seventh embodiment of a semiconductor device according to the present invention.
Figure 9B:
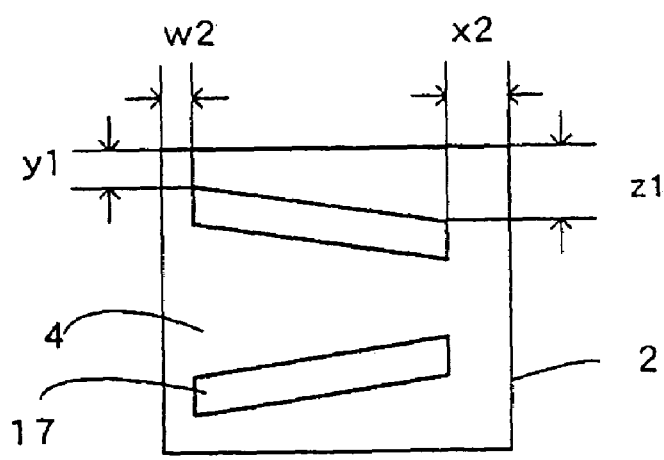
Figure 9C:
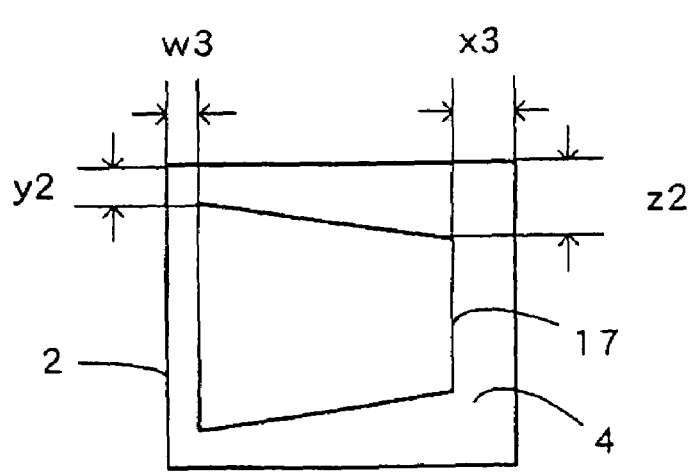
Figure 10A:
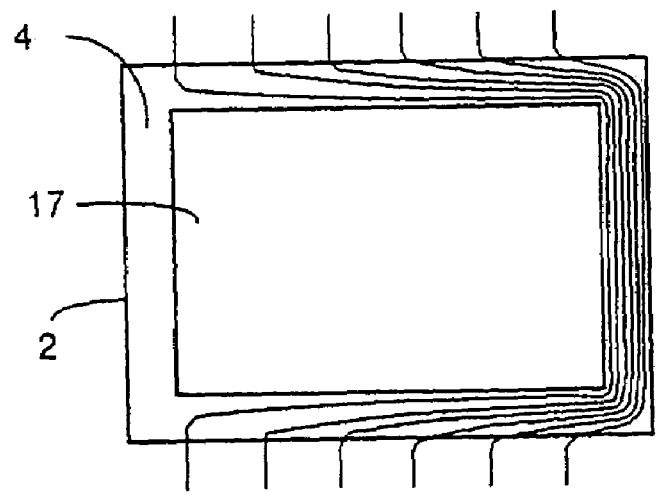
FIG. 10(*a*) shows equipotential curves describing the function of the electrical conductor according to the present invention.

FIGS. 9(a)–9(c) illustrate various modified seventh embodiments of a semiconductor device according to the present invention. In FIG. 9(a), the insulator 4 is buried in the trench 2 and the electrical conductors 17 are buried parallel to the side wall of the trenches 2 such that the distance x1 from the wall of the trench 2 on the drain side is longer than the distance w1 from the wall of the trench 2 on the source side. Since the equipotential lines localize to the drain side as illustrated in FIG. 10(a), the insulator can be set thicker on the drain side to relax the electric field localization. Since the n⁻-type drain drift region 3 can be doped heavily even on the source side by virtue of the field plate effect that electrical conductors 17 exhibit, the insulator can be set thinner on the source side.

Figure 10B:
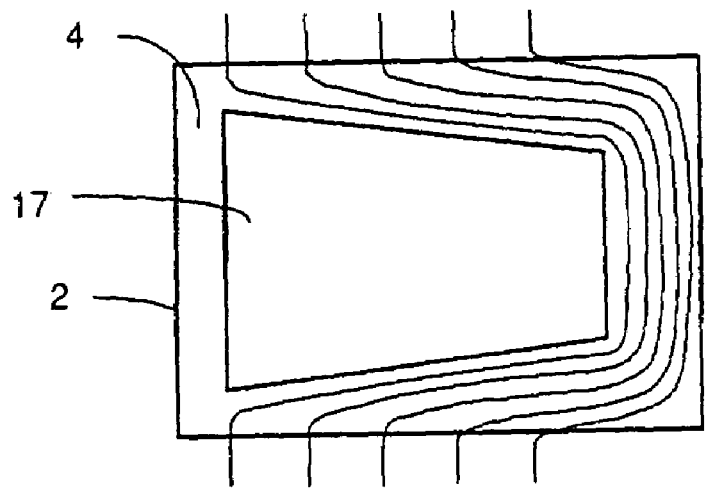
Figure 11:
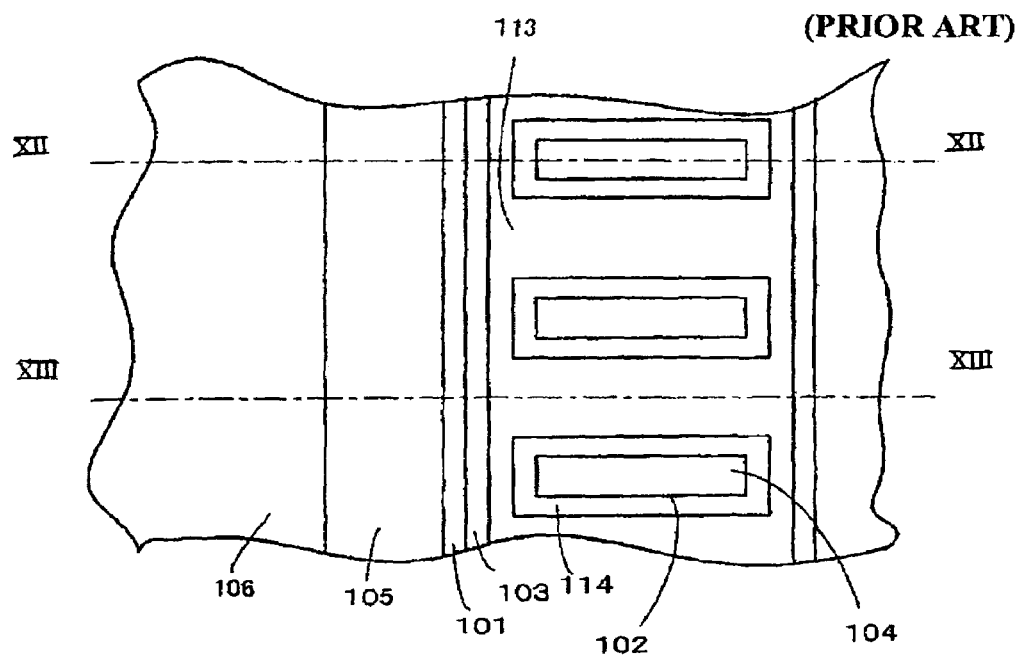
FIG. 11 is a top plan view of a conventional trench lateral MOSFET.
Figure 12:
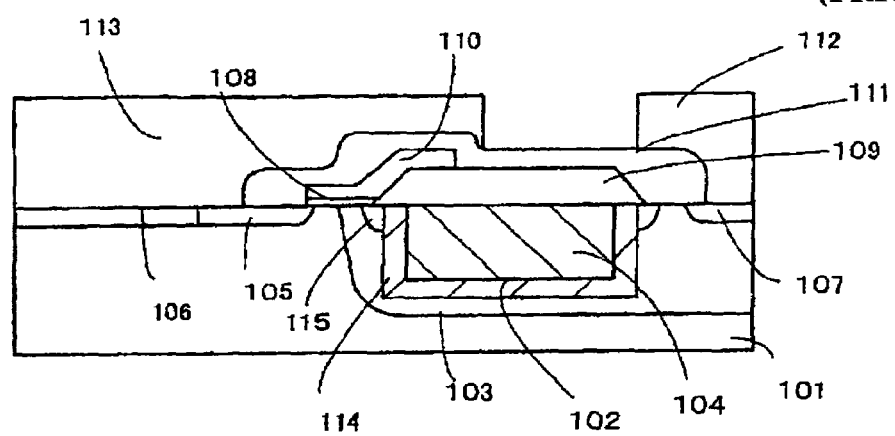
FIG. 12 is a cross section taken along line XII—XII of FIG. 11.
Figure 13:
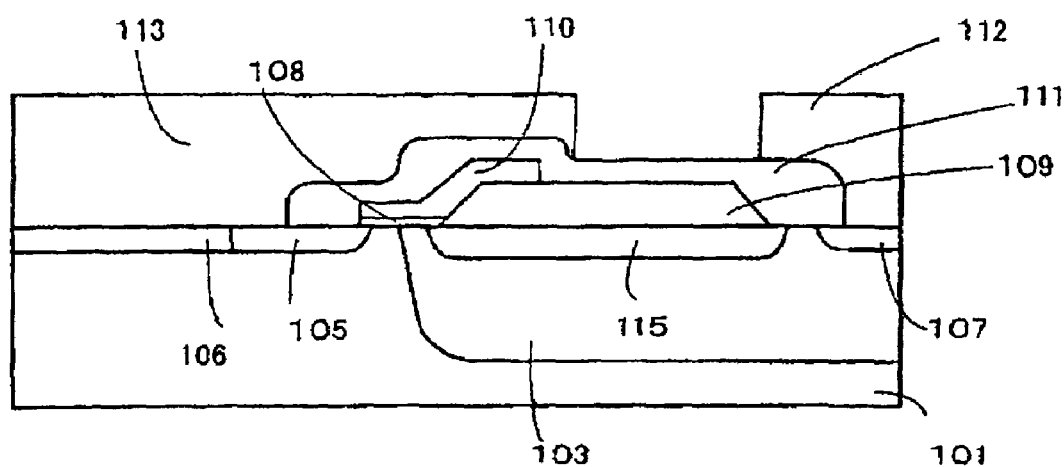
FIG. 13 is another cross section taken along line XIII—XIII of FIG. 11.

In FIGS. 9(b) and 9(c), the electrical conductors 17 or electrical conductor 17 is positioned such that the side walls thereof extend obliquely to the side walls of the trench 2 in the width direction of the trench 2. In FIG. 9(b), the thickness x2 of the insulator 4 on the drain side is larger than the thickness w2 thereof on the source side, and the thickness z1 of the insulator 4 on the drain side is larger than the thickness y1 thereof on the source side. In FIG. 9(c), the thickness x3 of the insulator 4 on the drain side is larger than the thickness w3 thereof on the source side, and the thickness z2 of the insulator 4 on the drain side is larger than the thickness y2 thereof on the source side. These structures are effective when the breakdown voltage of the device is set high. If one compares the electric field localization described in FIGS. 10(a) and 10(b), it is obvious that the structures described in FIGS. 9(b) and 9(c) facilitate to relax the electric field more effectively than the structure described in FIG. 9(a). Since the field plate effect is impaired when the insulator 4 is thick, the insulator 4 is formed thinner on the source side to make the electrical conductor 17 work as a field plate as much as possible.

The semiconductor device according to the invention, which includes a plurality of trenches aligned in the channel width direction in the MOSFET structure thereof and an n⁻-type drain drift region along the bottom walls and side walls of the trenches, includes a region doped with a p-type impurity and extending between the trenches. Since the n⁻-type drain drift region can be doped heavily by virtue of the existence of the p-type impurity region between the trenches, the semiconductor device according to the invention facilitates to reduce the tradeoff relation between the breakdown voltage and the on-resistance per unit device area.

The semiconductor device according to the present invention can reduce the on-resistance per unit area since currents flow through the side walls of the trenches, the bottom walls of the trenches and the surface portion of the substrate (semiconductor region). The area of the pn-junctions between the adjacent trenches is wider when the triple layer structure consisting of the drain drift region of the second conductivity type, the semiconductor region of the first conductivity type, and the drain drift region of the second conductivity type is between the adjacent trenches than when the semiconductor region of the first conductivity type is not between the adjacent trenches. The ratio of the p-type impurities to the n-type impurities in the drain drift region can be larger when the triple layer structure consisting of the drain drift region of the second conductivity type, the semiconductor region of the first conductivity type, and the drain drift region of the second conductivity type is between the adjacent trenches than when the semiconductor region of the first conductivity type is not between the adjacent trenches. Therefore, the entire drain drift region can be depleted easily.

Since the depletion layers expand from the pn-junction between the semiconductor region and the drain drift region and from the pn-junction between the electric field relaxation layer and the drain drift region, the resistance of the drain drift region can be set lower and, therefore, the on-resistance can be reduced. Moreover, since the depletion of the drain drift region is promoted between the adjacent trenches due to the field plate effect that the electrical conductor exhibits, the drain drift region can be doped heavily and the resistance of the device can be lowered. The same effects are obtained when only the drain drift region is between the adjacent trenches.

Although the invention has been described so far in connection with the preferred embodiments thereof, changes and modifications are obvious to those skilled in the art without departing from the gist of the invention. For example, the structures according to the first through fourth embodiments can be combined appropriately. Therefore, the invention be understood not by the specific descriptions herein but by the appended claims thereof.

The disclosure of the priority application, JP 2002-315988, in its entirety, including the drawings, claims, and the specification thereof, is incorporated herein by reference.

What is claimed is:

1. A semiconductor device comprising:
a semiconductor region of a first conductivity type;
a source region of a second conductivity type in one side of the semiconductor region;
a drain region of the second conductivity type in the one side of the semiconductor region and spaced apart from the source region;
trenches in the one side of the semiconductor region, between the source region and the drain region, and spaced apart laterally from the source region;
an insulator filling each of the trenches;
a drain drift region of the second conductivity type in the semiconductor region, the drain drift region being connected to the drain region, the drain drift region extending along side and bottom walls of the trenches, the drain drift region being spaced apart from the source region;
a gate insulation film on the surface of the semiconductor region between the source region and the drain drift region;
a gate electrode on the gate insulation film;
a source electrode connected electrically to the source region;
a drain electrode connected electrically to the drain region; and
a first triple layer structure formed of the drain drift region, the semiconductor region, and the drain drift region, the triple layer structure being between the adjacent trenches such that the drain drift region is between the adjacent trenches,
wherein the trenches are aligned in the width direction of the channels formed beneath the gate insulation film.

2. The semiconductor device according to claim 1, further including a well region of the first conductivity type doped more heavily than the semiconductor region, the drain drift region being in the well region, and a second triple layer structure formed of the drain drift region, the well region, and the drain drift region formed between the adjacent trenches.

3. The semiconductor device according to claim 1, further including one or more electric field relaxation layers of the first conductivity type in the drain drift region, and along the trenches.

4. The semiconductor device according to claim 2, further including one or more electric field relaxation layers of the first conductivity type in the drain drift region, and along the trenches.

5. The semiconductor device according to claim 3, wherein the one or more electric field relaxation layers are in the drain drift region between adjacent trenches.

6. The semiconductor device according to claim 4, wherein the one or more electric field relaxation layers are in the drain drift region between adjacent trenches.

7. The semiconductor device according to claim 1, further including one or more electrical conductors in the insulator in each of the trenches, and extending parallel to a side wall of the trenches formed between adjacent trenches.

8. The semiconductor device according to claim 2, further including one or more electrical conductors in the insulator in each of the trenches, and extending parallel to a side wall of the trenches formed between adjacent trenches.

9. The semiconductor device according to claim 3, further including one or more electrical conductors in the insulator in each of the trenches, and extending parallel to a side wall of the trenches formed between adjacent trenches.

10. The semiconductor device according to claim 4, further including one or more electrical conductors in the insulator in each of the trenches, and extending parallel to a side wall of the trenches formed between adjacent trenches.

11. The semiconductor device according to claim 5, further including one or more electrical conductors in the insulator in each of the trenches, and extending parallel to a side wall of the trenches formed between adjacent trenches.

12. The semiconductor device according to claim 6, further including one or more electrical conductors in the insulator in each of the trenches, and extending parallel to a side wall of the trenches formed between adjacent trenches.

13. The semiconductor device according to claim 3, wherein each of the one or more electric field relaxation layers is on the boundary between the drain drift region and the insulator in the trench.

14. The semiconductor device according to claim 4, wherein each of the one or more electric field relaxation layers is on the boundary between the drain drift region and the insulator in the trench.

15. The semiconductor device according to claim 5, wherein each of the one or more electric field relaxation layers is on the boundary between the drain drift region and the insulator in the trench.

16. The semiconductor device according to claim 6, wherein each of the one or more electric field relaxation layers is on the boundary between the drain drift region and the insulator in the trench.

17. The semiconductor device according to claim 7, wherein each of the one or more electric field relaxation layers is on the boundary between the drain drift region and the insulator in the trench.

18. The semiconductor device according to claim 8, wherein each of the one or more electric field relaxation layers is on the boundary between the drain drift region and the insulator in the trench.

19. A semiconductor device comprising:
a semiconductor region of a first conductivity type;
a source region of a second conductivity type in one side of the semiconductor region;
a drain region of the second conductivity type in the one side of the semiconductor region and spaced apart laterally from the source region;
trenches in the one side of the semiconductor region, between the source region and the drain region, and spaced apart from the source region;
an insulator filling each of the trenches;
a drain drift region of the second conductivity type in the semiconductor region, the drain drift region being connected to the drain region, the drain drift region extending along side and bottom walls of the trenches, the drain drift region being spaced apart from the source region;
a gate insulation film on the surface of the semiconductor region between the source region and the drain drift region;
a gate electrode on the gate insulation film;
a source electrode connected electrically to the source region;
a drain electrode connected electrically to the drain region; and
one or more electrical conductors in the insulator in each of the trenches, the one or more electrical conductors extending parallel to a side wall of the trench formed between adjacent trenches,
wherein the trenches are aligned in the width direction of the channels formed beneath the gate insulation film.

20. The semiconductor device according to claim 19, wherein the thickness of the insulator between the one or more electrical conductors and the side wall of the trench on the drain side is larger than the thickness of the insulator between the one or more electrical conductors and the side wall of the trench on the source side.

* * * * *